US012642121B2

(12) United States Patent
Gotoh

(10) Patent No.: US 12,642,121 B2
(45) Date of Patent: May 26, 2026

(54) SEMICONDUCTOR DEVICE AND SEMICONDUCTOR MODULE

(71) Applicant: FUJI ELECTRIC CO., LTD.,
Kawasaki (JP)

(72) Inventor: Masahide Gotoh, Matsumoto-city (JP)

(73) Assignee: FUJI ELECTRIC CO., LTD.,
Kanagawa (JP)

( * ) Notice: Subject to any disclaimer, the term of this patent is extended or adjusted under 35 U.S.C. 154(b) by 372 days.

(21) Appl. No.: 18/172,352

(22) Filed: Feb. 22, 2023

(65) Prior Publication Data

US 2023/0317649 A1 Oct. 5, 2023

(30) Foreign Application Priority Data

Mar. 30, 2022 (JP) ................................. 2022-055018

(51) Int. Cl.
*H01L 23/00* (2006.01)
(52) U.S. Cl.
CPC .............. *H01L 24/05* (2013.01); *H01L 24/03* (2013.01); *H01L 2224/0345* (2013.01); *H01L 2224/03464* (2013.01); *H01L 2224/04034* (2013.01); *H01L 2224/05007* (2013.01); *H01L 2224/05078* (2013.01); *H01L 2224/05082* (2013.01); *H01L 2224/05155* (2013.01); *H01L 2224/05166* (2013.01); *H01L 2224/05171* (2013.01); *H01L 2224/05179* (2013.01);
(Continued)

(58) Field of Classification Search
CPC ........... H01L 24/05; H01L 2224/03464; H01L 23/49562
See application file for complete search history.

(56) References Cited

U.S. PATENT DOCUMENTS

| | | | |
|---|---|---|---|
| 2003/0203661 A1 | 10/2003 | Ono | |
| 2013/0295294 A1 | 11/2013 | Ishizaki | |
| 2014/0284790 A1 | 9/2014 | Matsumoto | |

(Continued)

FOREIGN PATENT DOCUMENTS

| | | |
|---|---|---|
| JP | 2003297868 A | 10/2003 |
| JP | 2003324120 A | 11/2003 |

(Continued)

OTHER PUBLICATIONS

Office Action issued for counterpart Japanese Application No. 2022-055018, transmitted from the Japanese Patent Office on Sep. 30, 2025 (drafted on Sep. 17, 2025).

(Continued)

*Primary Examiner* — Wael M Fahmy
*Assistant Examiner* — Fernando Jose Ramos-Diaz

(57) ABSTRACT

A semiconductor device, including: a front-surface-side metal layer provided above a semiconductor substrate; a plated layer provided on an upper surface of the front-surface-side metal layer; a barrier layer which is provided on the upper surface of the front-surface-side metal layer, and provided being in direct contact with the plated layer on the upper surface of the front-surface-side metal layer; and an insulation protecting layer provided on the barrier layer, is provided. A semiconductor module, including: the semiconductor device; a lead frame provided above a front-surface-side metal layer; and an adhesive layer for connecting the front-surface-side metal layer to the lead frame, is provided.

20 Claims, 17 Drawing Sheets

(52) U.S. Cl.
CPC ................. *H01L 2224/0518* (2013.01); *H01L 2224/05181* (2013.01); *H01L 2224/05184* (2013.01)

(56)                    References Cited

U.S. PATENT DOCUMENTS

| | | |
|---|---|---|
| 2017/0084699 A1 | 3/2017 | Hoshi |
| 2022/0336598 A1* | 10/2022 | Yamanaka ............... H10D 8/60 |

FOREIGN PATENT DOCUMENTS

| | | | |
|---|---|---|---|
| JP | 2007115853 A | | 5/2007 |
| JP | 2009111188 A | * | 5/2009 |
| JP | 2013234343 A | | 11/2013 |
| JP | 2014099444 A | | 5/2014 |
| JP | 2014187073 A | | 10/2014 |
| JP | 2016111290 A | * | 6/2016 |
| JP | 2017059720 A | | 3/2017 |
| WO | 2021065722 A1 | | 4/2021 |

OTHER PUBLICATIONS

Office Action issued for counterpart Japanese Application No. 2022-055018, transmitted from the Japanese Patent Office on Feb. 24, 2026 (drafted on Feb. 13, 2026).

\* cited by examiner

160

138

230

220

38

210

60

E38

E62

62

E60

100

52

10

200

230

538

220

210

62

52

10

P1

500

Z

Y X

500

100

SEMICONDUCTOR DEVICE AND SEMICONDUCTOR MODULE

The contents of the following Japanese patent application(s) are incorporated herein by reference:
NO. 2022-055018 filed in JP on Mar. 30, 2022

BACKGROUND

1. Technical Field

The present invention relates to a semiconductor device and a semiconductor module.

2. Related Art

Patent Document 1 describes that "the clip CL is electrically connected to the anode electrode AE via the plated film NP and the solder SO2".

PRIOR ART DOCUMENTS

Patent Documents

Patent Document 1: Japanese Patent Application Publication No. 2014-099444
Patent Document 2: Japanese Patent Application Publication No. 2016-111290
Patent Document 3: Japanese Patent Application Publication No. 2017-059720
Patent Document 4: Japanese Patent Application Publication No. 2007-115853
Patent Document 5: Japanese Patent Application Publication No. 2013-234343
Patent Document 6: Japanese Patent Application Publication No. 2003-297868
Patent Document 7: Japanese Patent Application Publication No. 2003-324120

SUMMARY

A semiconductor device in which generation of a crack is prevented will be provided.

DESCRIPTION OF EXEMPLARY EMBODIMENTS

Hereinafter, the present invention will be described through embodiments of the invention, but the following embodiments do not limit the invention according to the claims. In addition, some combinations of features described in the embodiments may not be essential for the solving means of the invention.

In the present specification, one side in a direction parallel to a depth direction of a semiconductor substrate is referred to as an "upper" side, and the other side is referred to as a "lower" side. One of two principal surfaces of a substrate, a layer or another member is referred to as an upper surface, and the other is referred to as a lower surface. "Upper", "lower", "front", and "back" directions are not limited by a gravitational direction, or a direction of attachment on a substrate etc. at a time of mounting the semiconductor device.

As used herein, a technical matter may be described with orthogonal coordinate axes consisting of an X axis, a Y axis, and a Z axis. As used herein, an XY plane refers to a plane parallel to an upper surface of the semiconductor substrate, and the Z axis refers to a depth direction of the semiconductor substrate. In the present specification, a plan view refers to a view of the semiconductor substrate seen in the Z axis direction.

In each example, a first conductivity type is described as N type, and a second conductivity type is described as P type. However, the first conductivity type can be P type and the second conductivity type can be N type instead. In that case, conductivity type of a substrate, a layer, a region, and the like in the each example will be of inverse polarity.

As used herein, when a layer or a region is labeled with a letter n or p, it means that electrons or holes are majority carriers, respectively, in the layer or the region. In addition, when a plus sign or a minus sign is attached to the letter n or p of the layer or the region, it means that the layer or the region has a doping concentration higher or lower, respectively, than that of a layer or a region labeled without these signs.

Figure 1:
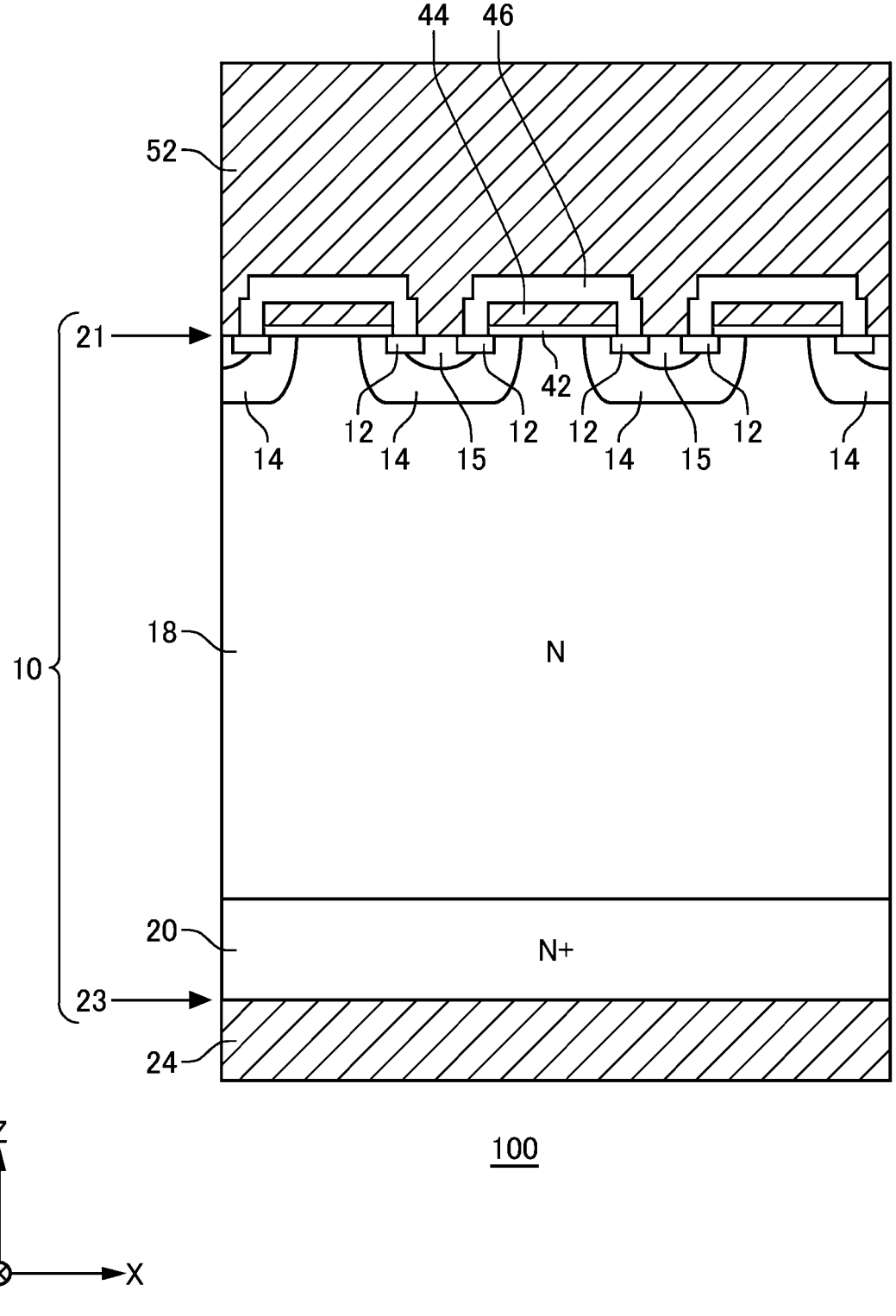
FIG. 1 illustrates one example of a cross-sectional view of a semiconductor device 100.

FIG. 1 illustrates one example of a cross-sectional view of a semiconductor device 100. The semiconductor device 100 includes a source region 12, a base region 14, a contact region 15, a drift region 18, and a first conductivity type region 20, which are provided in a semiconductor substrate 10.

The semiconductor substrate 10 may be a silicon substrate, a silicon carbide substrate, or a nitride semiconductor substrate or the like made of gallium nitride etc. The semiconductor substrate 10 includes a front surface 21 and a back surface 23.

A front-surface-side metal layer 52 is provided above the semiconductor substrate 10. A part of the front-surface-side metal layer 52 may be provided being in direct contact with the front surface 21. The front-surface-side metal layer 52 may be a metal film made of aluminum (Al) or alloy containing Al. Material for the front-surface-side metal layer 52 may contain at least one of aluminum-silicon alloy, aluminum-silicon-copper alloy, or aluminum-neodymium alloy. The front-surface-side metal layer 52 may also be a laminated film made by laminating a metal film made of Al or alloy containing Al on a barrier metal layer made of titanium (Ti) etc.

A back-surface-side metal layer 24 is provided below the semiconductor substrate 10. The back-surface-side metal layer 24 of the present example is provided being in direct contact with a back surface 23. The back-surface-side metal layer 24 is formed of material containing metal. The back-surface-side metal layer 24 may be a metal film made of Al or alloy containing Al. Material for the back-surface-side metal layer 24 may include at least one of aluminum-silicon alloy, aluminum-silicon-copper alloy, or aluminum-neodymium alloy. The back-surface-side metal layer 24 may also be a laminated film made by laminating a metal film made of Al or alloy containing Al on a barrier metal layer made of titanium (Ti) etc. For the back-surface-side metal layer 24, a laminated film made in the following steps may be used. Firstly, a titanium layer is formed and secondly, metal films of nickel and gold are laminated thereon in this order. Alternatively, the back-surface-side metal layer 24 may be a laminated film made of titanium, nickel, and silver.

The drift region 18 is a region of the first conductivity type provided in the semiconductor substrate 10. The drift region 18 of the present example is of N type, by way of example. The drift region 18 may be a region remained in the semiconductor substrate 10 without another doping region formed therein. That is, doping concentration of the drift region 18 may be doping concentration of the semiconductor substrate 10.

The base region 14 is a region of the second conductivity type provided on the front surface 21 of the semiconductor substrate 10. The base region 14 of the present example is of P-type.

The source region 12 is a region of the first conductivity type provided on the front surface 21 of the semiconductor substrate 10. The source region 12 of the present example is of N+ type. The source region 12 is provided on the base region 14.

The contact region 15 is a region of the second conductivity type provided on the front surface 21 of the semiconductor substrate 10. Doping concentration of the contact region 15 is higher than doping concentration of the base region 14. The contact region 15 in the present example is of P+ type. The contact region 15 is provided inside the base region 14. The contact region 15 of the present example is provided between two adjacent source regions 12, and be in direct contact with the two source regions 12.

The first conductivity type region 20 is provided closer to the back surface 23 in the drift region 18 in the semiconductor substrate 10. Doping concentration of the first conductivity type region 20 is higher than that of the drift region 18. The first conductivity type region 20 of the present example is of N+ type. The first conductivity type region 20 may be a seed crystal substrate of the semiconductor substrate 10. On the first conductivity type region 20, the drift region 18 may be formed by means of epitaxial growth.

A gate electrode 44 is provided sandwiching a gate insulating film 42 with the semiconductor substrate 10. An interlayer dielectric film 46 is provided on an upper surface and side surfaces of the gate electrode 44. In other words, surroundings of the gate electrode 44 may be covered by the gate insulating film 42 and the interlayer dielectric film 46. The gate electrode 44 may be provided between a plurality of source regions 12 in a direction parallel to the front surface 21. The base region 14 and the drift region 18 may be provided below the gate electrode 44.

The semiconductor device 100 may be a power semiconductor device for controlling electrical power, and the like. The semiconductor device 100 of the present example may have vertical structure in which the back-surface-side metal layer 24 is provided closer to the back surface 23 in the semiconductor substrate 10. Note that, a semiconductor device 100 can have horizontal structure in which no metal layer is provided closer to a back surface 23.

In the present example, a MOSFET with planar gate structure is used as the semiconductor device 100 for explanation. However, a semiconductor device 100 can be a MOSFET with trench gate structure, or can also be another semiconductor device such as a diode. A semiconductor device 100 can also be a wide band gap MOSFET made of SiC, GaN, or the like.

When the semiconductor substrate 10 is made of SiC, dopants of N type may be one or more elements selected from nitrogen (N) and phosphorous (P), and dopants of P type may be one or more elements selected from Al and boron (B). When the semiconductor substrate 10 is made of GaN, dopants of N type may be one or more elements selected from silicon (Si), germanium (Ge), sulfur (S), and oxygen (O), and dopants of P type may be one or more elements selected from magnesium (Mg), calcium (Ca), beryllium (Be), and zinc (Zn).

Figure 2:
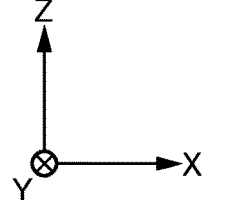
FIG. 2 illustrates one example of structure of a semiconductor module 200.

FIG. 2 illustrates one example of structure of a semiconductor module 200. The semiconductor module 200 of the present example includes a semiconductor device 100. The semiconductor device 100 of the present example includes a barrier layer 60, a plated layer 62, and an insulation protecting layer 38 above the front-surface-side metal layer 52 shown in FIG. 1. The semiconductor module 200 includes an adhesive layer 210, a lead frame 220, and a filling layer 230.

The barrier layer 60 is provided on an upper surface of the front-surface-side metal layer 52. The barrier layer 60 has an opening 160 on the front-surface-side metal layer 52. With this, the upper surface of the front-surface-side metal layer 52 is exposed and thus the plated layer 62 can grow thereon. As described below, the plated layer 62 may grow in a direction parallel to the front surface 21. The barrier layer 60 may be provided on the upper surface of the front-surface-side metal layer 52 and may be in direct contact with the plated layer 62. An end E60 of the barrier layer 60 may be provided on the front-surface-side metal layer 52, may be provided under the plated layer 62, and may be provided below the insulation protecting layer 38.

The barrier layer 60 may contain conductive material, or may contain insulative material. Material for the barrier layer 60 may not serve as a catalyst for growing the plated layer 62. The material for the barrier layer 60 may be different from the material for the front-surface-side metal layer 52. The material for the barrier layer 60 may contain at least one of TiN, TiW, W, Cr, Mo, Ta, Nb or $Si_3N_4$.

The plated layer 62 is provided on the upper surface of the front-surface-side metal layer 52. The plated layer 62 forms a pad electrode on an upper surface of the semiconductor device 100. The plated layer 62 is formed growing from the upper surface of the front-surface-side metal layer 52. In other words, the plated layer 62 does not grow from a region covered by the barrier layer 60 on the upper surface of the front-surface-side metal layer 52. The plated layer 62 may grow in the direction parallel to the front surface 21 of the semiconductor substrate 10, and may grow so as to cover an upper surface of the barrier layer 60. The barrier layer 60 and the plated layer 62 may be provided being in direct contact with each other in the direction parallel to the front surface 21. The end E62 of the plated layer 62 may be provided above the front-surface-side metal layer 52, may be provided on the barrier layer 60, and may be provided below the insulation protecting layer 38.

The plated layer 62 contains conductive material. Material for the plated layer 62 may be different from the material for the front-surface-side metal layer 52, and may be different from the material for the barrier layer 60. The plated layer 62 may be a nickel-plated layer. The plated layer 62 can be another plated layer such as a copper-plated layer.

The insulation protecting layer 38 is provided on the barrier layer 60. The insulation protecting layer 38 may be provided being in direct contact with the plated layer 62 on an upper surface of the plated layer 62. The insulation protecting layer 38 of the present example is provided extending from the upper surface of the barrier layer 60 to the upper surface of the plated layer 62. Material for the insulation protecting layer 38 may contain at least one of polyimide (PI), or polybenzoxazole (PBO). An end E38 of the insulation protecting layer 38 is provided being apart from the end E62 of the plated layer 62. The end E38 of the insulation protecting layer 38 may be provided above the front-surface-side metal layer 52, and may be provided on the plated layer 62. The end E38 may be positioned farther inward on the front surface 21 of the semiconductor substrate 10 than the end E60 of the barrier layer 60. The end E38 may be positioned farther inward on the front surface 21 of the semiconductor substrate 10 than the end E62 of the plated layer 62. Note that, in this cross-sectional view, the phrase "inward" refers to a positive side in an X axis direction, and a phrase "outward" refers to a negative side in the X axis direction while having the plated layer 62 as a center of the directions.

The adhesive layer 210 is provided between the lead frame 220 and the semiconductor device 100. The adhesive layer 210 is configured to connect the front-surface-side metal layer 52 to the lead frame 220. The adhesive layer 210 may electrically connect the lead frame 220 to the semiconductor device 100. The adhesive layer 210 may physically connect the lead frame 220 to the semiconductor device 100. The adhesive layer 210 may be solder for connecting the front-surface-side metal layer 52 to the lead frame 220. The adhesive layer 210 of the present example is configured to connect the lead frame 220 to the plated layer 62.

The lead frame 220 is connected to an external connection terminal for connecting to an outside of the semiconductor module 200. The lead frame 220 is provided above the front-surface-side metal layer 52. The lead frame 220 is provided above the plated layer 62. The lead frame 220 may be a board-shaped member made of copper etc. By using the lead frame 220, the semiconductor module 200 can be miniaturized, and its reliability under a high-temperature operation environment can be improved in a long span of time compared to a case of using a wire frame instead.

The filling layer 230 is a filling agent for filling a housing of the semiconductor module 200. Material for the filling layer 230 may be resin. The filling layer 230 may contain any filler. The filling layer 230 is provided on the insulation protecting layer 38. The filling layer 230 is provided so as to cover the semiconductor device 100, the adhesive layer 210, and the lead frame 220.

Figure 3:
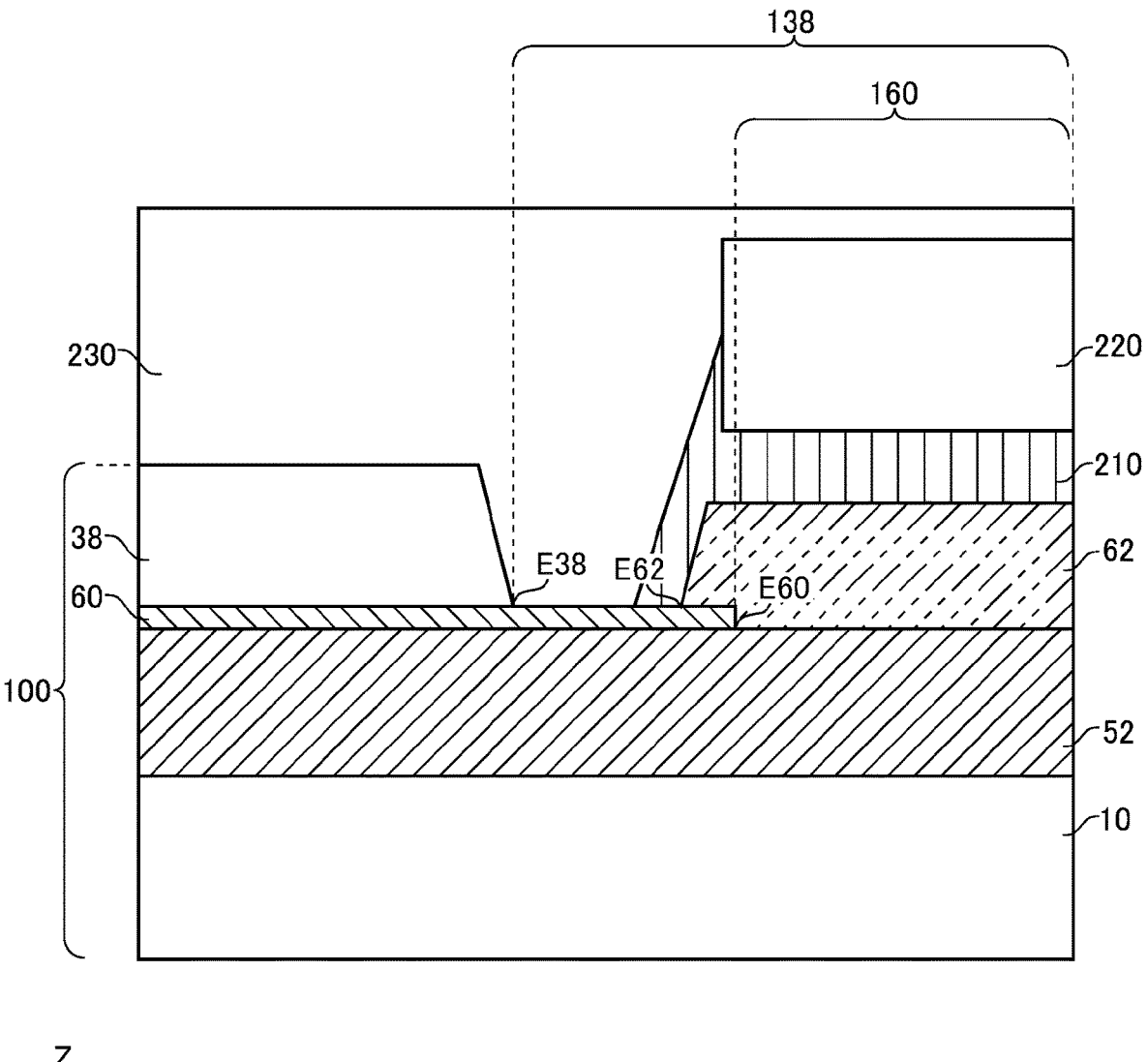
FIG. 3 illustrates a modification example of the structure of the semiconductor module 200.

FIG. 3 illustrates a modification example of the structure of the semiconductor module 200. The present example is different from the semiconductor module 200 shown in FIG. 2 in that an insulation protecting layer 38 is apart from a plated layer 62. In the present example, matters different from the semiconductor module 200 shown in FIG. 2 will be especially described.

The insulation protecting layer 38 is provided on a barrier layer 60. The insulation protecting layer 38 has an end E38 on the barrier layer 60. The end E38 may be positioned farther outward on a front surface 21 of a semiconductor substrate 10 than an end E60 of the barrier layer 60. The end E38 may be positioned farther outward on the front surface 21 of the semiconductor substrate 10 than an end E62 of a plated layer 62. The insulation protecting layer 38 has an opening 138 that extends over from a front-surface-side metal layer 52 to the barrier layer 60 in a direction parallel to the front surface 21 of the semiconductor substrate 10. As described above, the insulation protecting layer 38 can be provided without overlapping the plated layer 62.

The plated layer 62 is provided extending from an upper surface of the front-surface-side metal layer 52 to an upper surface of the barrier layer 60 in the direction parallel to the front surface 21. The end E62 of the plated layer 62 may be provided on the upper surface of the barrier layer 60. The end E62 of the plated layer 62 may be provided being apart from the end E38 of the insulation protecting layer 38 on the upper surface of the barrier layer 60. The end E62 of the plated layer 62 may be provided being apart from the end E60 of the barrier layer 60.

Figure 4A:
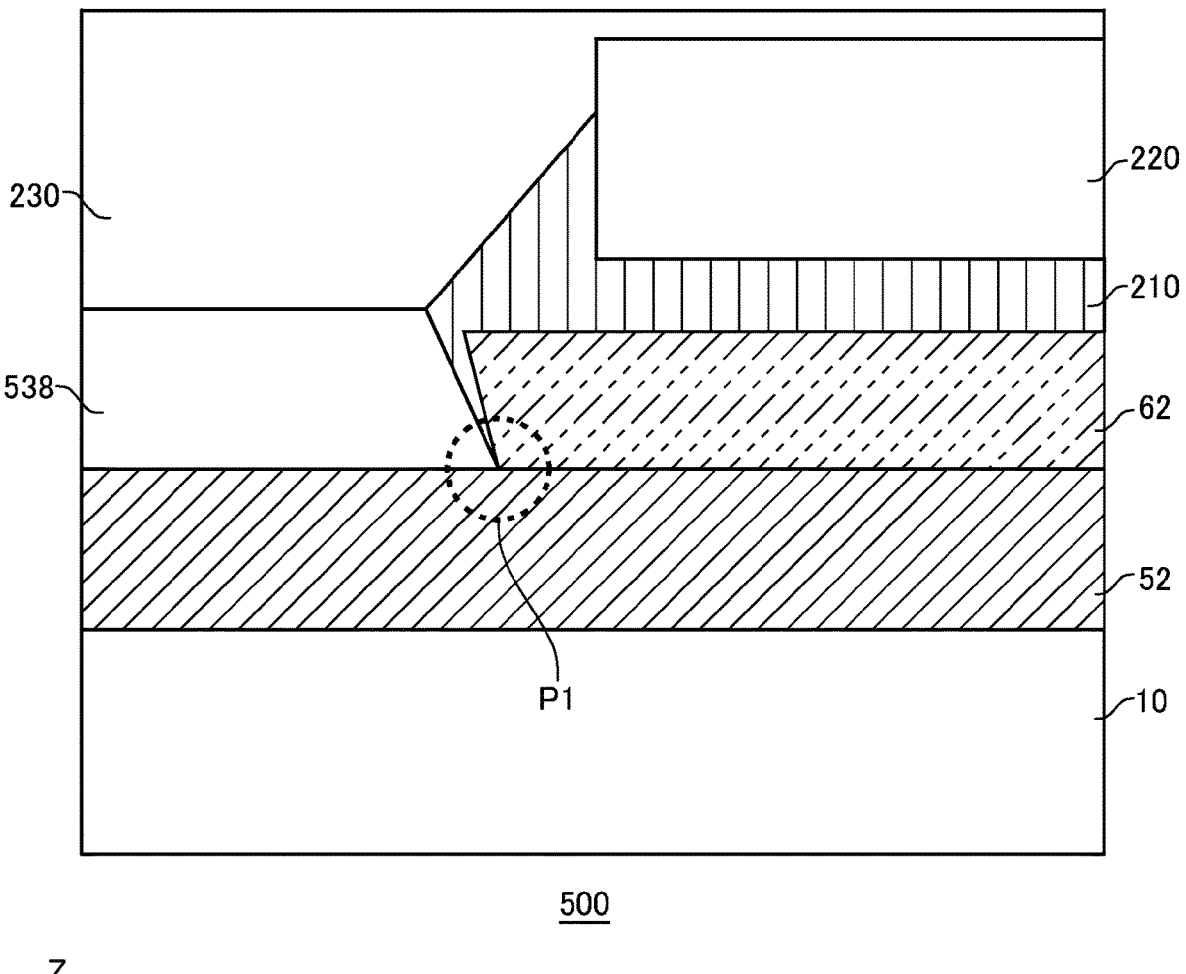
FIG. 4A illustrates one example of structure of a semiconductor module 500 in a comparative example.

FIG. 4A illustrates one example of structure of a semiconductor module 500 in a comparative example. The semiconductor module 500 of the present example is different from the examples shown in FIGS. 2 and 3 in that there is no barrier layer 60 included therein. An insulation protecting layer 538 is provided on an upper surface of a front-surface-side metal layer 52. After forming the insulation protecting layer 538, a plated layer 62 grows in a region not covered by the insulation protecting layer 538. From this, a triple point P1 is formed at which three types of members being the front-surface-side metal layer 52, the insulation protecting layer 538, and the plated layer 62 are gathered.

When soldering, if a gap is formed on an interface between the plated layer 62 and the insulation protecting layer 538 due to a difference in their coefficients of thermal expansion, an adhesive layer 210 enters forming a wedge shape in the gap, which may then cause a crack from the triple point P1. If the crack enters inside the front-surface-side metal layer 52, it may cause a malfunction to a semiconductor device 100.

Figure 4B:
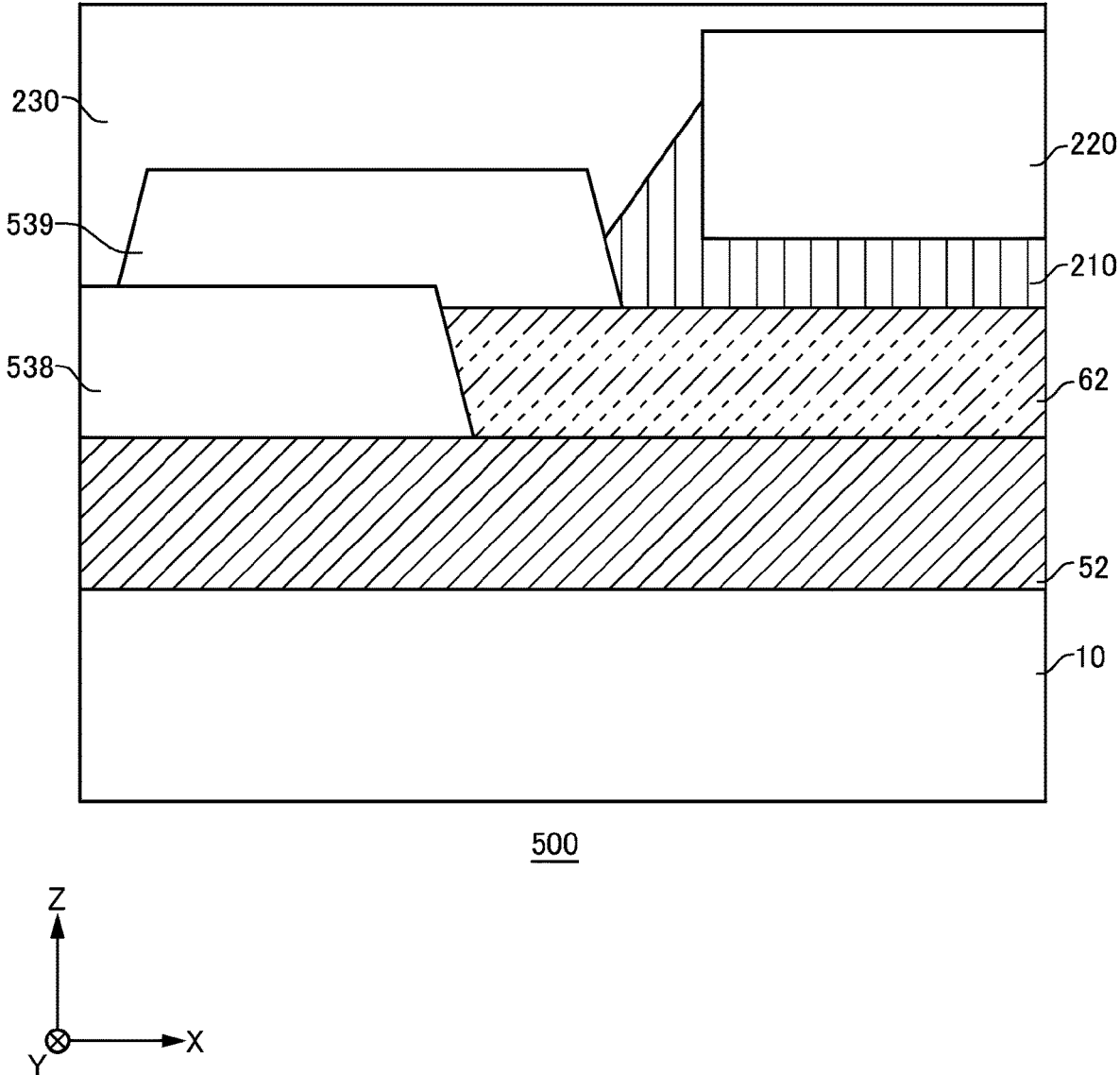
FIG. 4B illustrates one example of structure of a semiconductor module 500 in a comparative example.

FIG. 4B illustrates one example of structure of a semiconductor module 500 in a comparative example. The semiconductor module 500 of the present example is different from the examples shown in FIGS. 2 and 3 in that no barrier layer 60 is included, and a plurality of insulation protecting layers are included therein. The semiconductor module 500 of the present example includes an insulation protecting layer 538 and an insulation protecting layer 539 as the plurality of insulation protecting layers.

The insulation protecting layer 538 is provided on an upper surface of a front-surface-side metal layer 52. A plated layer 62 grows from an upper surface of the front-surface-side metal layer 52 which is exposed by an opening of the insulation protecting layer 538. The insulation protecting layer 539 is provided after forming the insulation protecting layer 538 and the plated layer 62, on an upper surface of the insulation protecting layer 538 and the plated layer 62. The insulation protecting layer 539 is configured to prevent an adhesive layer 210 from entering between the insulation protecting layer 538 and the plated layer 62. In the present example, a crack can be prevented from being formed. However, because the insulation protecting layer is formed again after the plating step, this need of repeating steps increases a number of manufacturing steps. Also, if a curing temperature for the insulation protecting layer 539 is set lower than a curing temperature for the insulation protecting layer 538 in order to prevent a crack, an adhesive substance will be remained in a manufacturing process due to a difference in their degrees of polymerization of polyimide, which may then cause improper appearance and device malfunction.

In contrast, the semiconductor device 100 can prevent the adhesive layer 210 from entering into a triple point by having the barrier layer 60 provided therein. Therefore, manufacturing steps can be simplified without a need of providing a plurality of insulation protecting layers 38. Further, by having one layer of the insulation protecting layer 38, the insulation protecting layer 38 having a uniform degree of polymerization can be deposited, and thereby occurrence of a defect can be prevented.

Figure 5A:
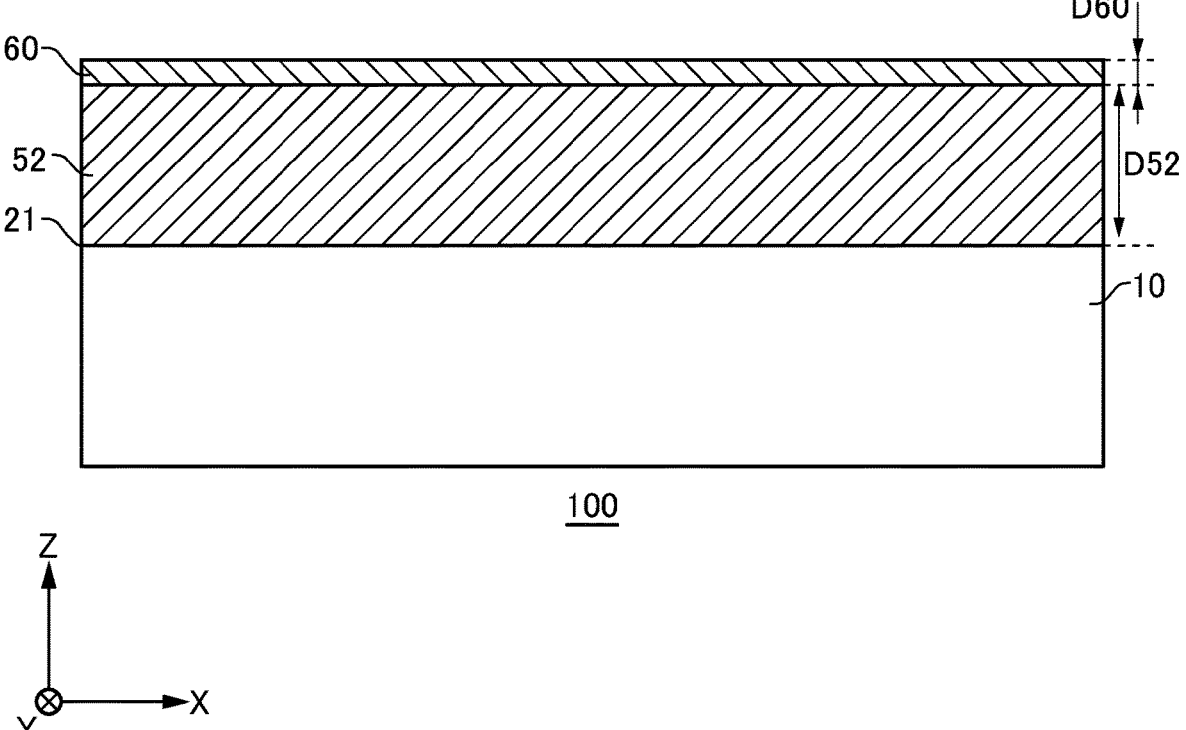
FIG. 5A is a cross-sectional view illustrating the semiconductor device 100 shown in FIG. 2 during its manufacturing process.

FIG. 5A is a cross-sectional view illustrating the semiconductor device 100 shown in FIG. 2 during its manufacturing process. The present example shows a cross-section of the semiconductor device 100 after depositing the barrier layer 60.

The front-surface-side metal layer 52 is formed on the front surface 21 of the semiconductor substrate 10 by using any method such as sputtering. A thickness D52 of the front-surface-side metal layer 52 may be, even if a part of the thickness is disappeared due to an effect of chemical solution used for zincate bath etc., on the order of thickness by which operations of the semiconductor device 100 is not affected. The thickness D52 of the front-surface-side metal layer 52 may be on the order of thickness that can be provided through processing within a practical etching time. The thickness D52 of the front-surface-side metal layer 52 may be thicker than a thickness D60 of the barrier layer 60 in a depth direction of the semiconductor substrate 10. The thickness D52 of the front-surface-side metal layer 52 may be, in the depth direction of the semiconductor substrate 10, from 1.0 µm to 6.0 µm, or from 2.0 µm to 5.5 µm.

The barrier layer 60 is formed on the upper surface of the front-surface-side metal layer 52. The barrier layer 60 may be deposited by any method such as sputtering. If the barrier layer 60 is insulative, the barrier layer 60 may be deposited by using a deposition technique such as CVD method. The barrier layer 60 may be made of material easy to be treated in etching processing, and may be material unlikely to be corroded by chemical solution of zincate bath or nickel-plating bath. For example, the barrier layer 60 may be made of TiN.

The thickness D60 of the barrier layer 60 may be on the order of thickness with which the chemical solution of the zincate bath can be prevented from entering into the front-surface-side metal layer 52. The thickness D60 of the barrier layer 60 may be on the order of thickness that can be provided through processing within a practical etching time. The thickness D60 of the barrier layer 60 may be thinner than a thickness of the plated layer 62 in the depth direction of the semiconductor substrate 10. The thickness D60 of the barrier layer 60 may be, in the depth direction of the semiconductor substrate 10, from 30.0 nm to 300.0 nm. The thickness D60 of the barrier layer 60 may be, in the depth direction of the semiconductor substrate 10, from 50.0 nm to 100.0 nm.

Figure 5B:
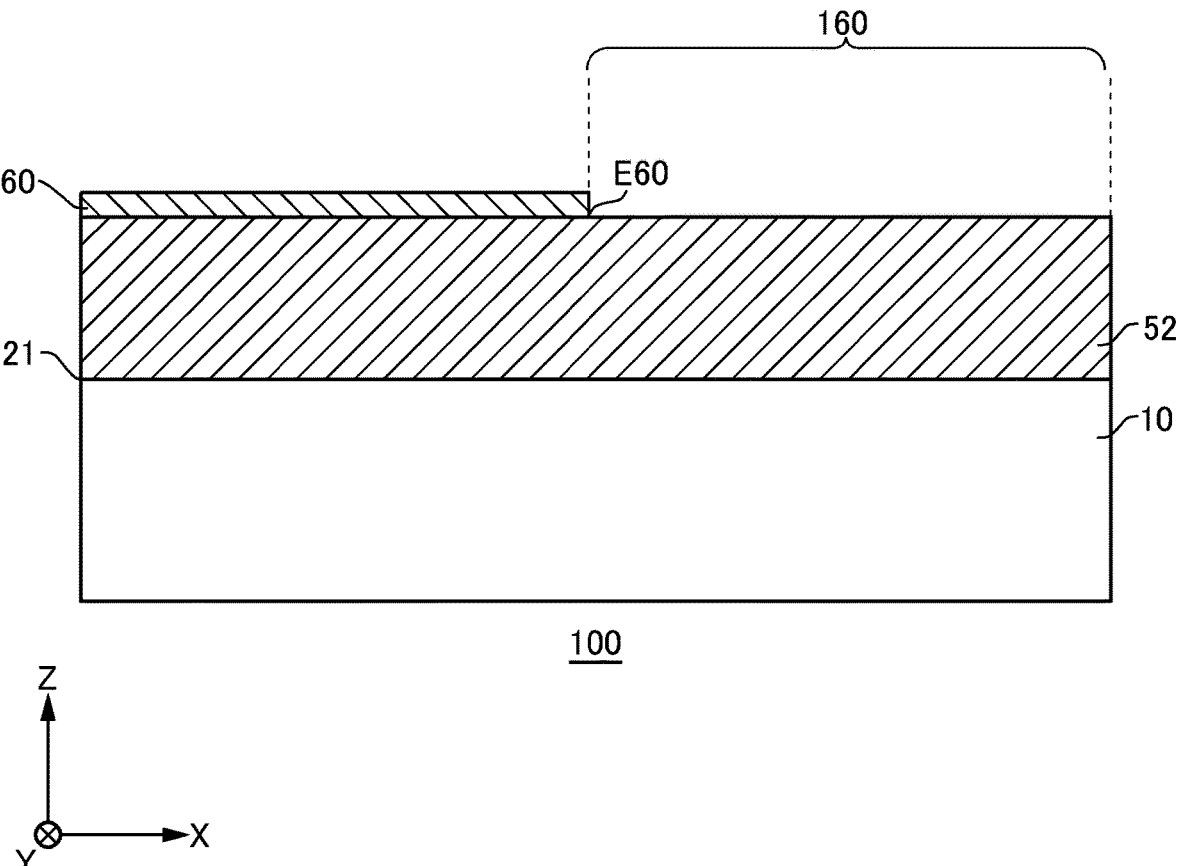
FIG. 5B is a cross-sectional view illustrating the semiconductor device 100 shown in FIG. 2 during its manufacturing process.

FIG. 5B is a cross-sectional view illustrating the semiconductor device 100 shown in FIG. 2 during its manufacturing process. The present example shows a cross-section of the semiconductor device 100 after etching the barrier layer 60. The opening 160 is formed by etching the barrier layer 60, and thereby the upper surface of the front-surface-side metal layer 52 is exposed. The end E60 indicates an end of the barrier layer 60 on the front-surface-side metal layer 52. If the barrier layer 60 is made of TiN, the etching may be performed by means of dry etching using $Cl_2/BCl_3$.

Note that, an etching mask may be formed before the etching, and the etching mask may be removed after the etching. By sequentially depositing the front-surface-side metal layer 52 and the barrier layer 60, adhesivity of the barrier layer 60 on the front-surface-side metal layer 52 can be improved. The phrase "sequentially depositing the front-surface-side metal layer 52 and the barrier layer 60" refers to a fact that there is no patterning step included between the deposition step of the front-surface-side metal layer 52 and the deposition step of the barrier layer 60.

Figure 5C:
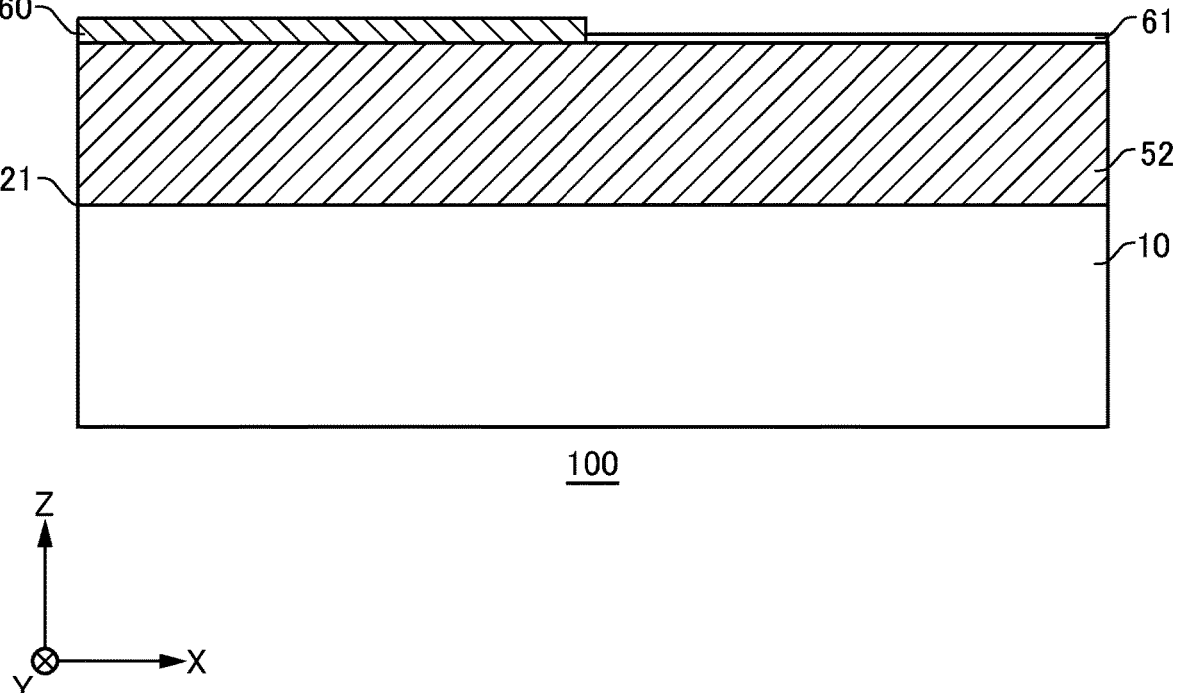
FIG. 5C is a cross-sectional view illustrating the semiconductor device 100 shown in FIG. 2 during its manufacturing process.

FIG. 5C is a cross-sectional view illustrating the semiconductor device 100 shown in FIG. 2 during its manufacturing process. The present example shows a cross-section of the semiconductor device 100 after forming a replaced layer 61.

The replaced layer 61 is provided on the upper surface of the front-surface-side metal layer 52. The replaced layer 61 may be made of Zn that has replaced Al in the front-surface-side metal layer 52 in the zincate bath. Because Zn has less ionization tendency than Al, Al is replaced by Zn in an outermost surface of the front-surface-side metal layer 52 by means of the zincate bath. On the other hand, in a region having the barrier layer 60, the chemical solution of the zincate bath is blocked by the barrier layer 60 and thus cannot reach the front-surface-side metal layer 52, thereby Al is not replaced by Zn. As a result, the replaced layer 61 is formed only on the outermost surface of the front-surface-side metal layer 52. The replaced layer 61 may be formed in a double zincate step in which immersion in the zincate bath is repeated twice.

Figure 5D:
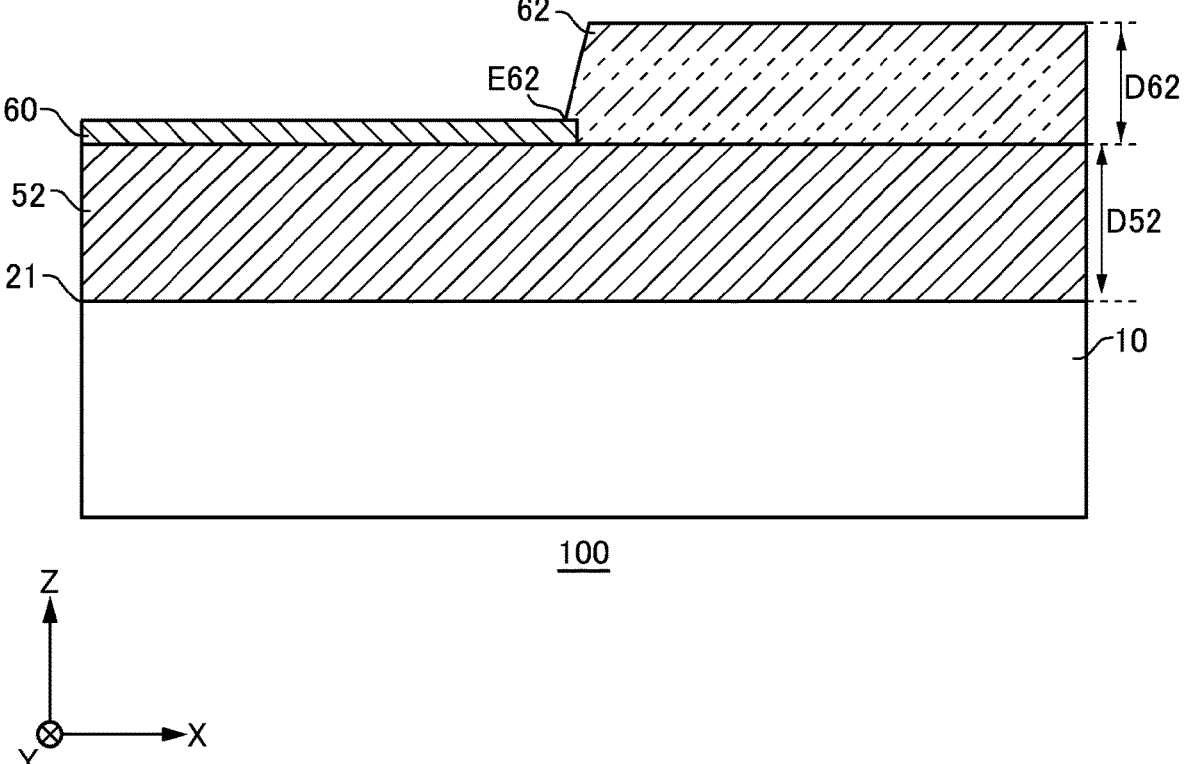
FIG. 5D is a cross-sectional view illustrating the semiconductor device 100 shown in FIG. 2 during its manufacturing process.

FIG. 5D is a cross-sectional view illustrating the semiconductor device 100 shown in FIG. 2 during its manufacturing process. The present example shows a cross-section of the semiconductor device 100 after forming the plated layer 62.

The plated layer 62 is formed growing from the upper surface of the front-surface-side metal layer 52. The plated layer 62 not only grows in the depth direction of the semiconductor substrate 10 but also grows in a direction parallel to the front surface 21. In the direction parallel to the front surface 21 of the semiconductor substrate 10, the plated layer 62 may be provided extending from the upper surface of the front-surface-side metal layer 52 to the upper surface of the barrier layer 60. The plated layer 62 of the present example covers an upper surface of the end E62 of the barrier layer 60. A distance on the upper surface of the barrier layer 60 covered by the plated layer 62 may be equal to or greater than a thickness D62 of the plated layer 62.

The plated layer 62 is formed by means of a plating bath of nickel or the like. The plated layer 62 may be formed by means of an electroless Ni—P plating bath. Whether the plated layer 62 has been formed by a plating step can be determined by analyzing phosphorous (P) contained in the plated layer 62. The plated layer 62 can be formed by means of an electroless plating bath, or can be formed by means of an electroplating bath.

The electroless plating bath is convenient and very safe because reaction is caused to progress by immersing in the chemical solution. Because Ni has less ionization tendency than Zn, Zn is replaced by Ni by means of the Ni plating bath nearby the replaced layer 61, and then the Ni itself that has replaced serves as a catalyst with which growth of the plated layer 62 progresses. The thickness D62 of the plated layer 62 may be decided depending on magnitude of electrical power used with the semiconductor device 100. The thickness D62 of the plated layer 62 may be a thickness with which diffusion of Sn, which is a main component of solder, into the front-surface-side metal layer 52 can be prevented. The thickness D62 of the plated layer 62 may be, in the depth direction of the semiconductor substrate 10, from 3.0 μm to 6.0 μm. The thickness D52 of the front-surface-side metal layer 52 may be thicker than the thickness D62 of the plated layer 62 in the depth direction of the semiconductor substrate 10.

Figure 5E:
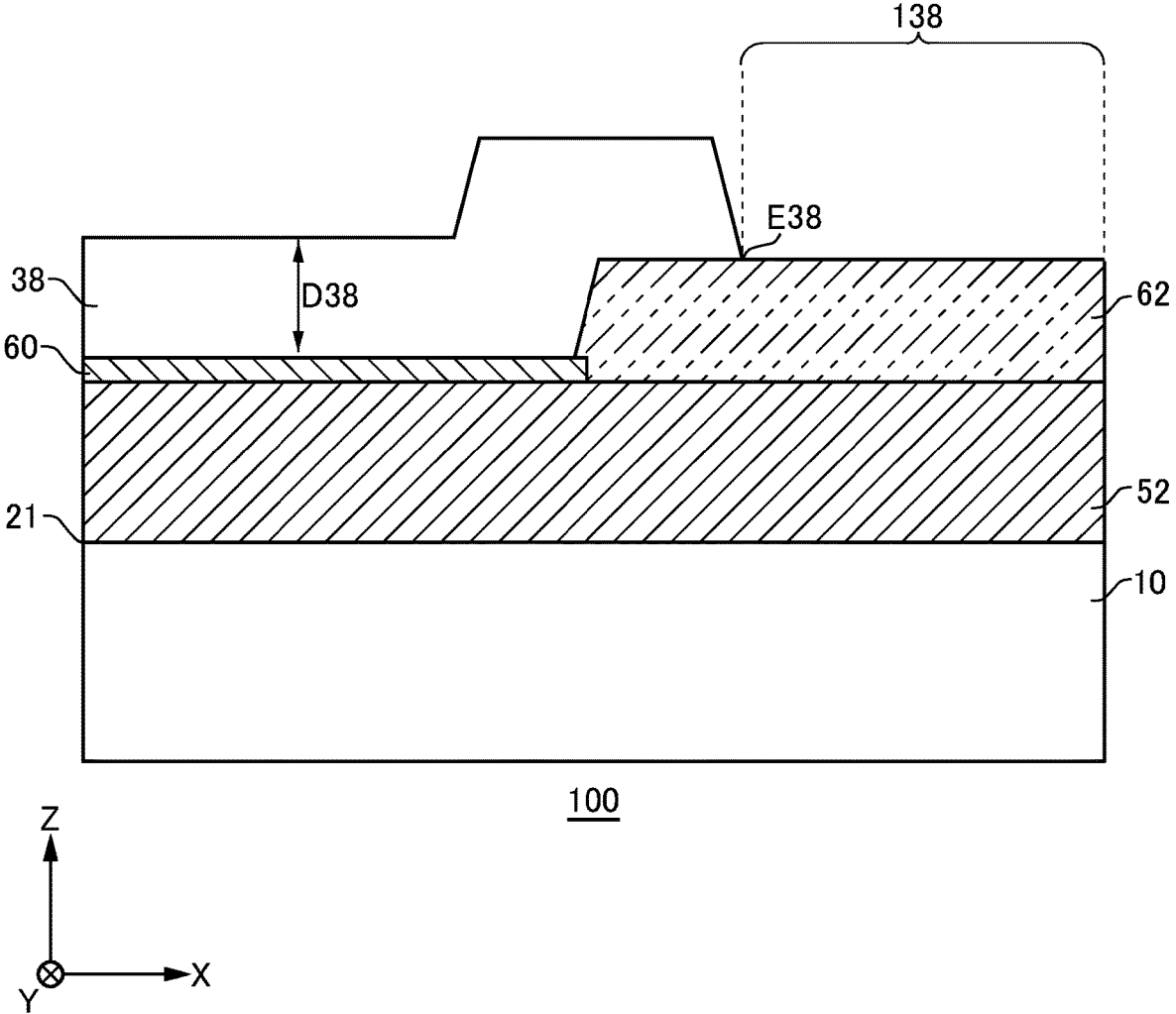
FIG. 5E is a cross-sectional view illustrating the semiconductor device 100 shown in FIG. 2 during its manufacturing process.

FIG. 5E is a cross-sectional view illustrating the semiconductor device 100 shown in FIG. 2 during its manufacturing process. The present example shows a cross-section of the semiconductor device 100 after forming the insulation protecting layer 38.

The insulation protecting layer 38 is formed on the upper surfaces of the plated layer 62 and the barrier layer 60. The insulation protecting layer 38 of the present example is provided overlapping from the barrier layer 60 to the plated layer 62 in the direction parallel to the front surface 21 of the semiconductor substrate 10. On the insulation protecting layer 38, the opening 138 may be formed by which the plated layer 62 is exposed. The end E38 of the insulation protecting layer 38 may terminate on the plated layer 62. A thickness D38 of the insulation protecting layer 38 may be thicker than the thickness D60 of the barrier layer 60 in the depth direction of the semiconductor substrate 10. The thickness D38 of the insulation protecting layer 38 may be, in the depth direction of the semiconductor substrate 10, from 1.0 μm to 10.0 μm.

The insulation protecting layer 38 may be a coating film formed by using spin coating technique or the like. Material for the insulation protecting layer 38 may be non-photosensitive polyimide. The opening 138 may be provided on the insulation protecting layer 38 by patterning the insulation protecting layer 38 with a photoresist used as an etching mask. The photoresist may be removed after being used. The insulation protecting layer 38 may be cured at a temperature of less than 300 degrees Celsius in an atmosphere of nitrogen.

The manufacturing steps of the semiconductor device 100 may end with the step shown in this drawing. When manufacturing the semiconductor module 200 by using the semiconductor device 100, steps for manufacturing the adhesive layer 210, the lead frame 220, the filling layer 230, and the like may further be performed.

Figure 5F:
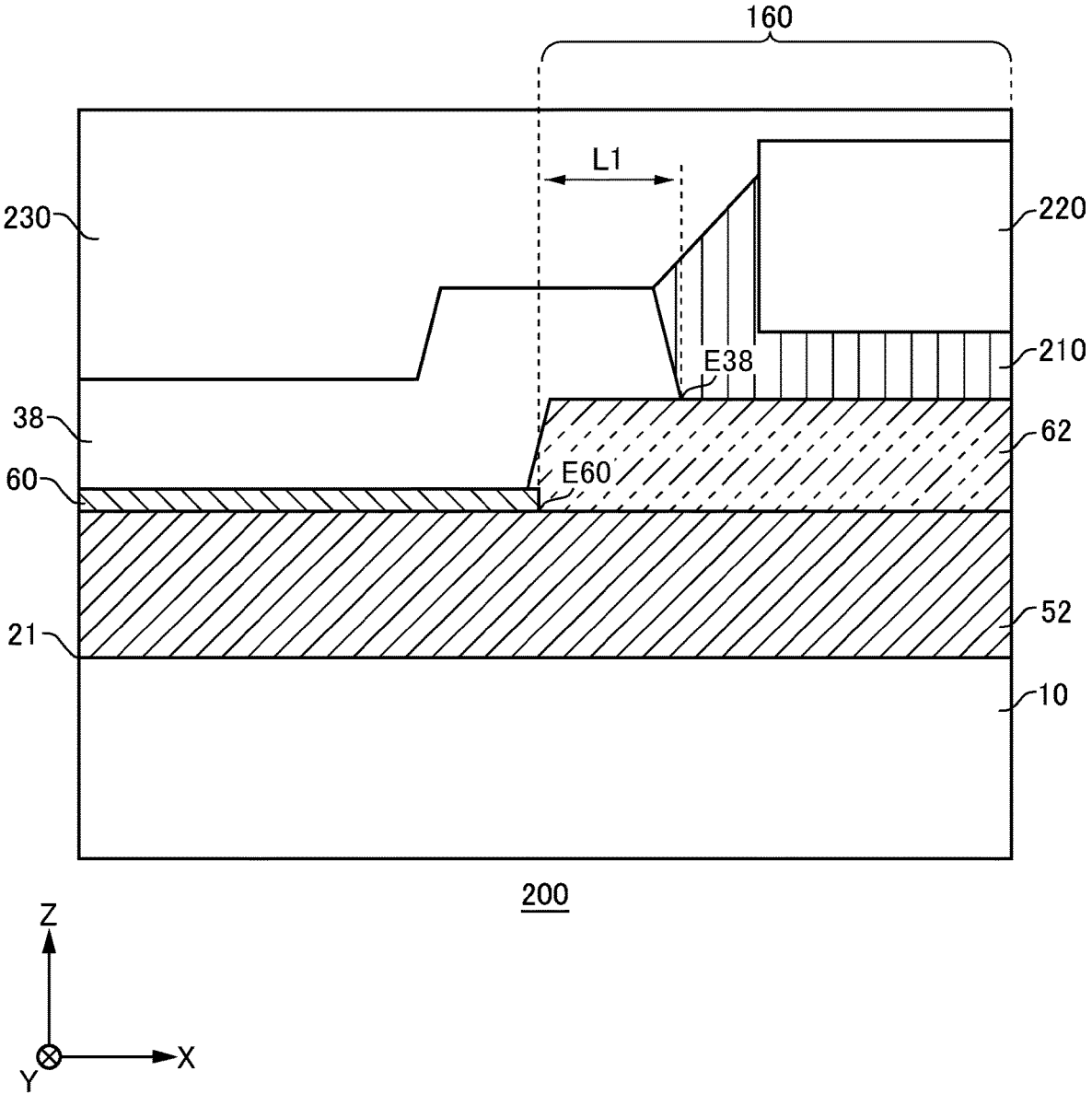
FIG. 5F is a cross-sectional view illustrating the semiconductor module 200 shown in FIG. 2 during its manufacturing process.

FIG. 5F is a cross-sectional view illustrating the semiconductor module 200 shown in FIG. 2 during its manufacturing process. The present example illustrates a cross-section of the semiconductor module 200 after forming the filling layer 230.

The adhesive layer 210 and the lead frame 220 are provided on the upper surface of the plated layer 62. The lead frame 220 is fixed to the upper surface of the plated layer 62 via the adhesive layer 210. The lead frame 220 is provided being apart from the insulation protecting layer 38 and the plated layer 62. The housing of the semiconductor module 200 may be filled with the filling layer 230 being resin or the like.

The insulation protecting layer 38 of the present example is provided overlapping the plated layer 62. A distance L1 refers to a distance in which the insulation protecting layer 38 overlaps the plated layer 62 provided in the opening 160 of the barrier layer 60. The distance L1 may be a distance from the end E60 of the barrier layer 60 to the end E38 of the insulation protecting layer 38 in the direction parallel to the front surface 21. The distance L1 may be long enough not to cause the adhesive layer 210 to enter into an interface between the plated layer 62 and the insulation protecting layer 38 and thereby enter into a region nearby the front-surface-side metal layer 52. The distance L1 may be equal to or greater than the thickness D62 of the plated layer 62.

An upper limit of an area in which the insulation protecting layer 38 overlaps the plated layer 62 provided in the opening 160 of the barrier layer 60 may be decided such that an electric characteristic required for the semiconductor device 100 is satisfied with that area. A lower limit of the area in which the insulation protecting layer 38 overlaps the plated layer 62 provided in the opening 160 of the barrier layer 60 may be decided from a viewpoint of prevention of the adhesive layer 210 that enters into the interface between the plated layer 62 and the insulation protecting layer 38. The area in which the insulation protecting layer 38 overlaps the plated layer 62 provided in the opening 160 of the barrier layer 60 may be larger than 0% and equal to or smaller than 10% of an area in which the plated layer 62 and the front-surface-side metal layer 52 directly contact each other.

Figure 6A:
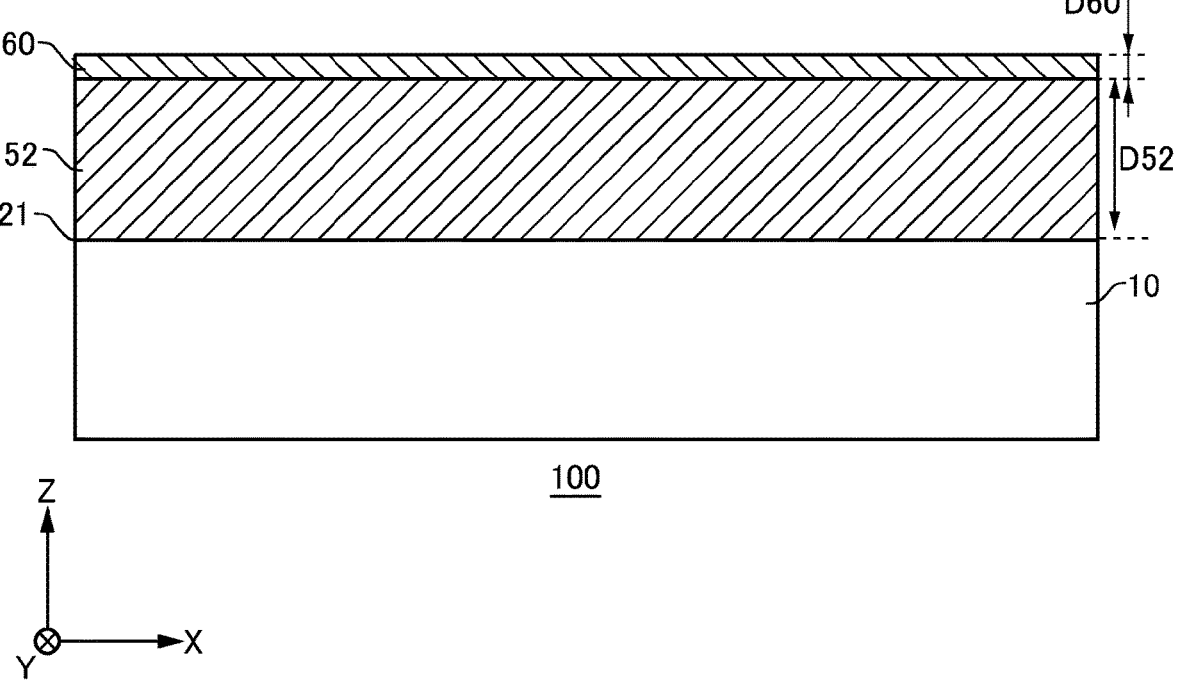
FIG. 6A is a cross-sectional view illustrating the semiconductor device 100 shown in FIG. 3 during its manufacturing process.

FIG. 6A is a cross-sectional view illustrating the semiconductor device 100 shown in FIG. 3 during its manufacturing process. In the present example, a cross-section of the semiconductor device 100 after depositing the barrier layer 60 is shown. After depositing the barrier layer 60 on the upper surface of the front-surface-side metal layer 52, the semiconductor device 100 may be in a same state as that of the example shown in FIG. 5A.

Figure 6B:
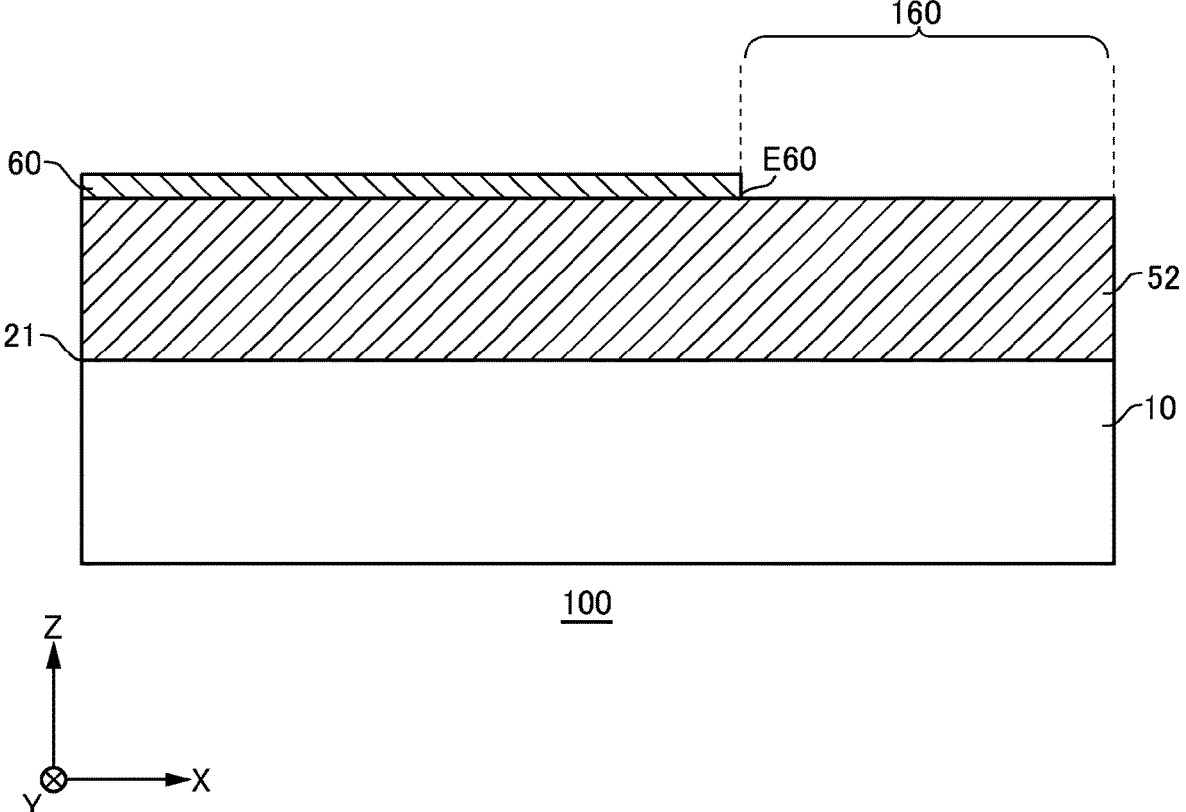
FIG. 6B is a cross-sectional view illustrating the semiconductor device 100 shown in FIG. 3 during its manufacturing process.

FIG. 6B is a cross-sectional view illustrating the semiconductor device 100 shown in FIG. 3 during its manufacturing process. The present example shows a cross-section of the semiconductor device 100 after etching the barrier layer 60. After forming the opening 160 on the barrier layer 60, the semiconductor device 100 may be in a same state as that of the example shown in FIG. 5B.

Figure 6C:
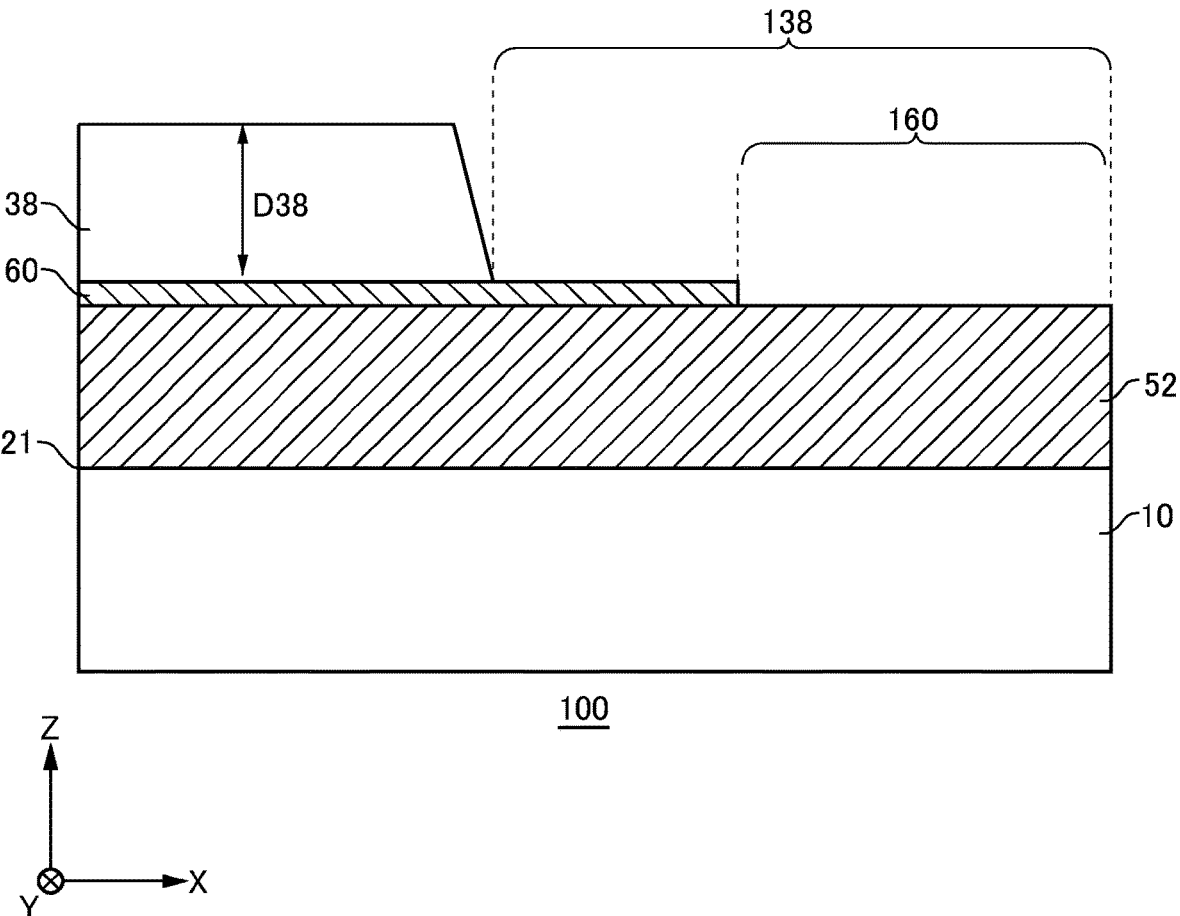
FIG. 6C is a cross-sectional view illustrating the semiconductor device 100 shown in FIG. 3 during its manufacturing process.

FIG. 6C is a cross-sectional view illustrating the semiconductor device 100 shown in FIG. 3 during its manufacturing process. The present example illustrates a cross-section of the semiconductor device 100 after forming the insulation protecting layer 38. The present example is different from the example shown in FIG. 5C in that the insulation protecting layer 38 is formed before forming the replaced layer 61.

The insulation protecting layer 38 is formed after forming the barrier layer 60. The insulation protecting layer 38 may be formed before forming the plated layer 62. The insulation protecting layer 38 can be formed after forming the replaced layer 61, and before forming the plated layer 62. Because the insulation protecting layer 38 of the present example is not formed on the plated layer 62, the insulation protecting layer 38 can be formed before forming the plated layer 62. The insulation protecting layer 38 may be formed in a same method as the method described with reference to FIG. 5E. Here, the insulation protecting layer 38 can be formed after forming the plated layer 62.

The insulation protecting layer 38 may be cured at a temperature of from 300 degrees Celsius to 400 degrees Celsius in an atmosphere of nitrogen. If the plated layer 62 is annealed at a high temperature at this stage, a crack may be generated. By virtue of forming the insulation protecting layer 38 before the plated layer 62, the insulation protecting layer 38 can be cured at a relatively high temperature regardless of heat resistance of the plated layer 62. Note that, the insulation protecting layer 38 can be cured at a temperature lower than 300 degrees Celsius in an atmosphere of nitrogen.

Figure 6D:
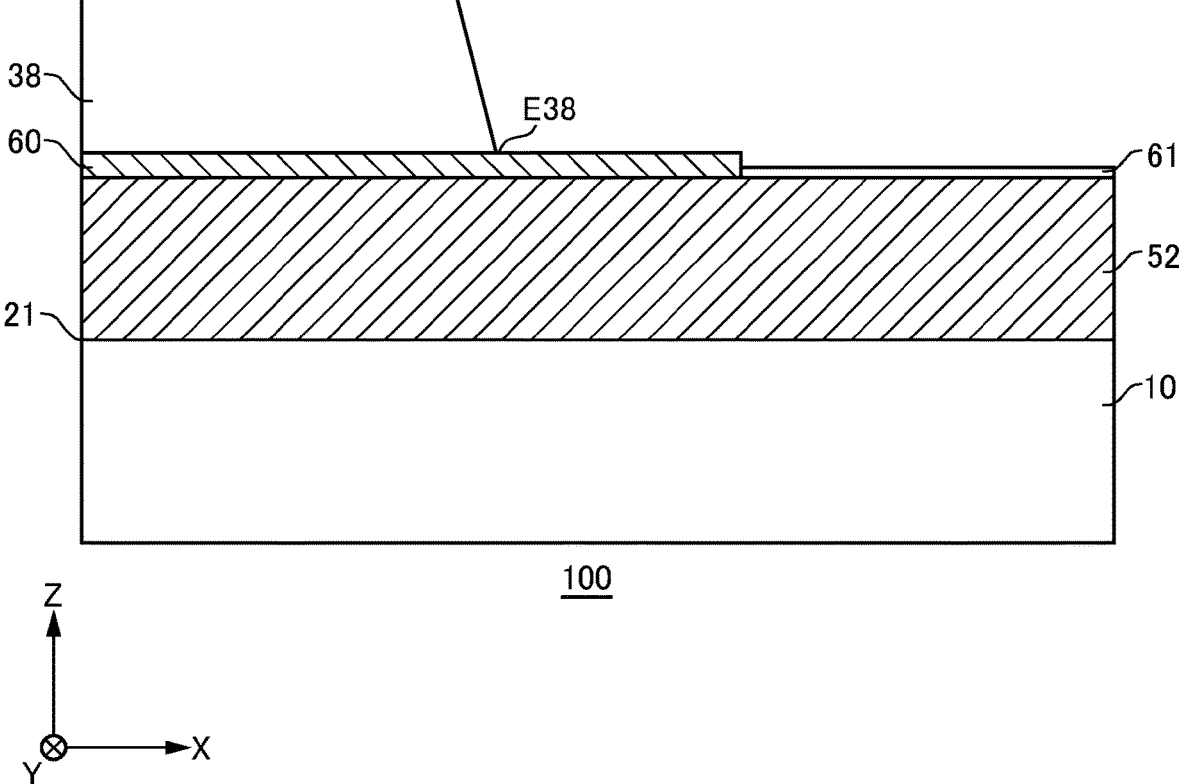
FIG. 6D is a cross-sectional view illustrating the semiconductor device 100 shown in FIG. 3 during its manufacturing process.

FIG. 6D is a cross-sectional view illustrating the semiconductor device 100 shown in FIG. 3 during its manufacturing process. The present example shows a cross-section of the semiconductor device 100 after forming the replaced layer 61. The replaced layer 61 of the present example is formed on the upper surface of the front-surface-side metal layer 52 after forming the insulation protecting layer 38 on the upper surface of the barrier layer 60. Even in this case also, the replaced layer 61 is only formed on the upper surface of the front-surface-side metal layer 52 and not formed on upper surfaces of the insulation protecting layer 38 and the barrier layer 60. The replaced layer 61 may be formed in a same method as the method described with reference to FIG. 5C. Note that, the replaced layer 61 can be formed before forming the insulation protecting layer 38.

Figure 6E:
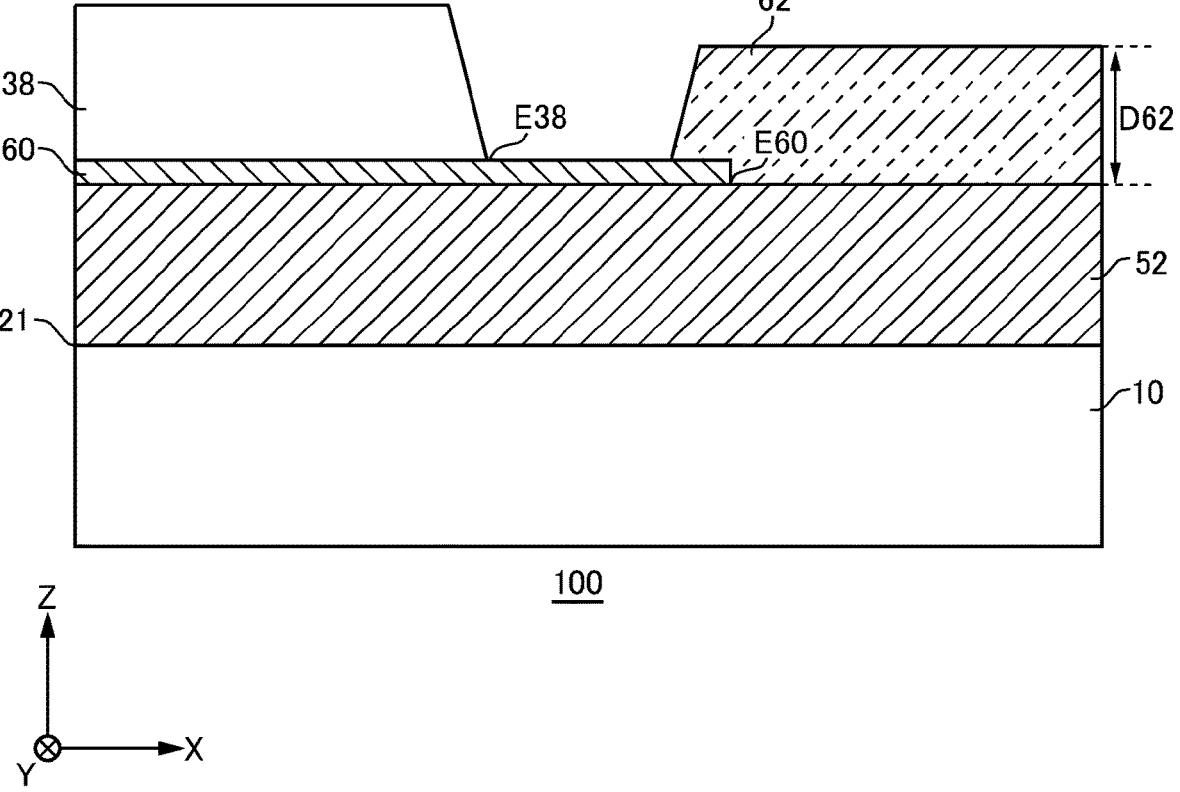
FIG. 6E is a cross-sectional view illustrating the semiconductor device 100 shown in FIG. 3 during its manufacturing process.

FIG. 6E is a cross-sectional view illustrating the semiconductor device 100 shown in FIG. 3 during its manufacturing process. The present example shows a cross-section of the semiconductor device 100 after forming the plated layer 62. The plated layer 62 of the present example is formed on the upper surface of the front-surface-side metal layer 52 after forming the insulation protecting layer 38 on the upper surface of the barrier layer 60.

The insulation protecting layer 38 of the present example is provided without overlapping the plated layer 62. The plated layer 62 may be provided overlapping the barrier layer 60.

Figure 6F:
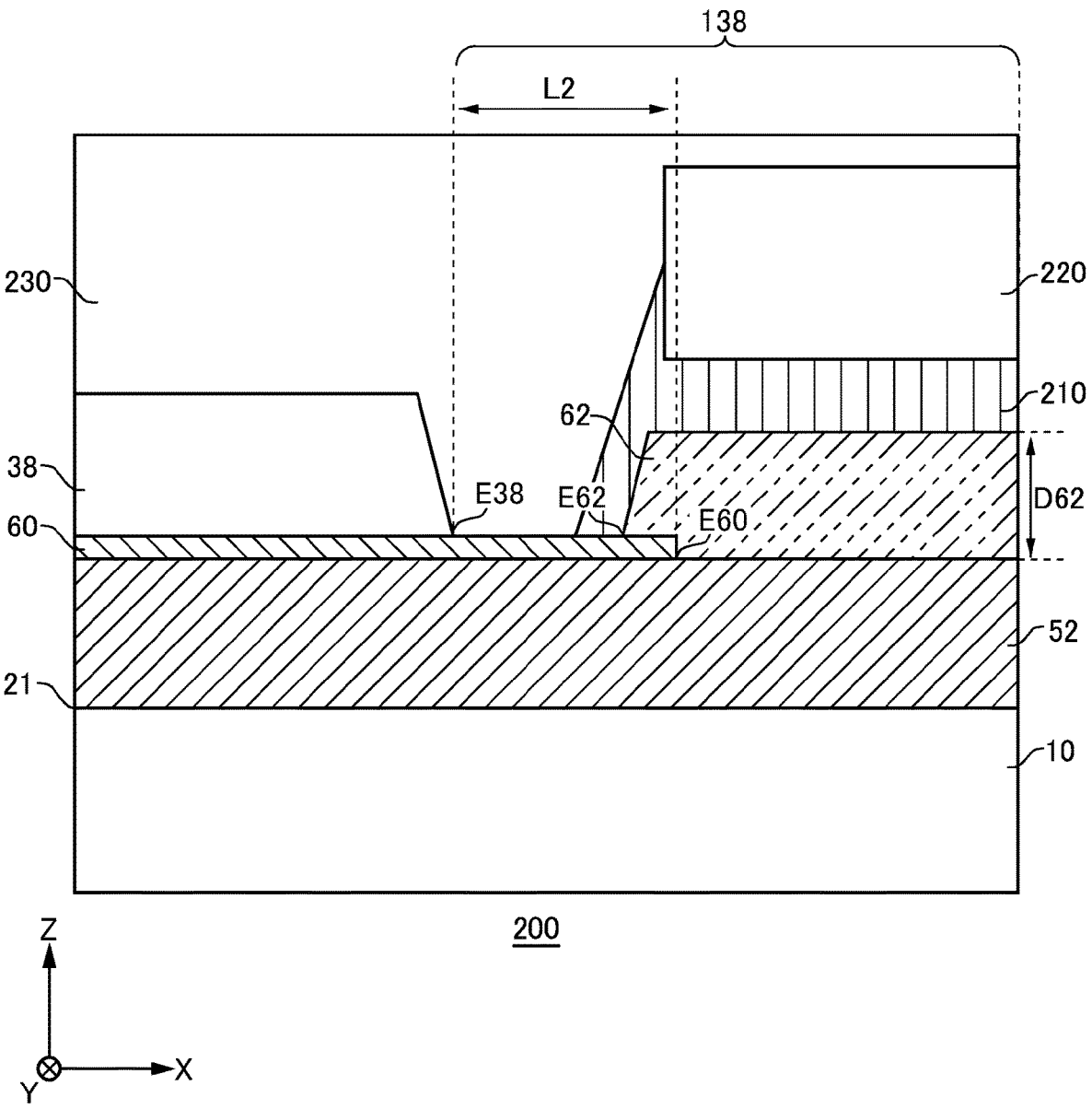
FIG. 6F is a cross-sectional view illustrating the semiconductor module 200 shown in FIG. 3 during its manufacturing process.

FIG. 6F is a cross-sectional view illustrating the semiconductor module 200 shown in FIG. 3 during its manufacturing process. The present example illustrates a cross-section of the semiconductor module 200 after forming the filling layer 230.

A distance L2 is a distance between the end E38 of the insulation protecting layer 38 and the end E60 of the barrier layer 60 in the direction parallel to the front surface 21. That is, the distance L2 corresponds to a distance between an open end of the insulation protecting layer 38 and an open end of the barrier layer 60 in the direction parallel to the front surface 21 of the semiconductor substrate 10. The distance L2 may be equal to or greater than the thickness D62 of the plated layer 62. By making the distance L2 equal to or greater than the thickness D62 of the plated layer 62, the insulation protecting layer 38 and the plated layer 62 can be apart from each other even if the plated layer 62 grows in a lateral direction. By virtue of making the insulation protecting layer 38 and the plated layer 62 apart from each other, generation of a crack can be prevented.

While the present invention has been described with the embodiments, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can also be included in the technical scope of the present invention.

The operations, procedures, steps, stages, or the like of each process performed by a device, system, program, and method shown in the claims, specification, or diagrams can be performed in any order as long as the order is not specified by a phrase "prior to," "before," or the like and as long as the output from a previous process is not used in a later process. Even if an operation flow is described using phrases such as "firstly" or "secondly" in the claims, specification, or diagrams, it does not mean that the process must be performed in this order.

EXPLANATION OF REFERENCES

10: semiconductor substrate;
12: source region;
14: base region;
15: contact region;
18: drift region;
20: first conductivity type region;
21: front surface;
23: back surface;
24: back-surface-side metal layer;
38: insulation protecting layer;
42: gate insulating film;
44: gate electrode;
46: interlayer dielectric film;
52: front-surface-side metal layer;
60: barrier layer;
61: replaced layer;
62: plated layer;
100: semiconductor device;
138: opening;
160: opening;
200: semiconductor module;
210: adhesive layer;
220: lead frame;
230: filling layer;
500: semiconductor module;
538: insulation protecting layer;
539: insulation protecting layer.

What is claimed is:
1. A semiconductor device, comprising:
a front-surface-side metal layer provided above a semiconductor substrate;
a plated layer provided on an upper surface of the front-surface-side metal layer;
a barrier layer which is provided on the upper surface of the front-surface-side metal layer, and provided being in direct contact with the plated layer on the upper surface of the front-surface-side metal layer; and an insulation protecting layer provided on the barrier layer, wherein the barrier layer is formed of Titanium nitride (TiN), and an end of the plated layer which is horizontally adjacent to the barrier layer and vertically in contact with the front-surface-side metal layer is provided apart from and not overlapped by the insulation protecting layer.

2. The semiconductor device according to claim 1, wherein a thickness of the front-surface-side metal layer is thicker than a thickness of the plated layer, and thicker than a thickness of the barrier layer in a depth direction of the semiconductor substrate.

3. The semiconductor device according to claim 1, wherein a thickness of the front-surface-side metal layer is from 1.0 µm to 6.0 µm in a depth direction of the semiconductor substrate.

4. The semiconductor device according to claim 1, wherein material for the front-surface-side metal layer contains at least one of aluminum-silicon alloy, aluminum-silicon-copper alloy, or aluminum-neodymium alloy.

5. The semiconductor device according to claim 1, wherein a thickness of the barrier layer is thinner than a thickness of the plated layer in a depth direction of the semiconductor substrate.

6. The semiconductor device according to claim 1, wherein a thickness of the barrier layer is from 30.0 nm to 300.0 nm in a depth direction of the semiconductor substrate.

7. The semiconductor device according to claim 1, wherein a thickness of the plated layer is from 3.0 µm to 6.0 µm in a depth direction of the semiconductor substrate.

8. The semiconductor device according to claim 1, wherein the plated layer is a nickel-plated layer.

9. The semiconductor device according to claim 1, wherein the plated layer is provided extending from the upper surface of the front-surface-side metal layer to an upper surface of the barrier layer in a direction parallel to a front surface of the semiconductor substrate.

10. The semiconductor device according to claim 1, wherein a thickness of the insulation protecting layer is thicker than a thickness of the barrier layer in a depth direction of the semiconductor substrate.

11. The semiconductor device according to claim 1, wherein a thickness of the insulation protecting layer is from 1.0 µm to 10.0 µm in a depth direction of the semiconductor substrate.

12. The semiconductor device according to claim 1, wherein material for the insulation protecting layer contains at least one of polyimide or polybenzoxazole.

13. The semiconductor device according to claim 1, wherein:

the insulation protecting layer is provided overlapping from the barrier layer to the plated layer in a direction parallel to a front surface of the semiconductor substrate; and an end of the insulation protecting layer terminates on the plated layer.

14. The semiconductor device according to claim 13, wherein an area in which the insulation protecting layer overlaps the plated layer provided in an opening of the barrier layer is larger than 0% and equal to or smaller than 10% of an area in which the plated layer and the front-surface-side metal layer directly contact each other.

15. The semiconductor device according to claim 13, wherein a distance in which the insulation protecting layer overlaps the plated layer provided in an opening of the barrier layer is equal to or greater than a thickness of the plated layer.

16. The semiconductor device according to claim 1, wherein the insulation protecting layer has an opening that extends over from the front-surface-side metal layer to the barrier layer in a direction parallel to a front surface of the semiconductor substrate.

17. The semiconductor device according to claim 16, wherein:

the barrier layer has an opening on the front-surface-side metal layer; and an open end of the insulation protecting layer and an open end of the barrier layer are apart from each other by a thickness of the plated layer or more in a direction parallel to a front surface of the semiconductor substrate.

18. The semiconductor device according to claim 1, having vertical structure including a back-surface-side metal layer on a back-surface-side of the semiconductor substrate.

19. A semiconductor module, comprising:

the semiconductor device according to claim 1;

a lead frame provided above the front-surface-side metal layer; and an adhesive layer for connecting the front-surface-side metal layer to the lead frame.

20. A semiconductor device, comprising:

a front-surface-side metal layer provided above a semiconductor substrate;

a plated layer provided on an upper surface of the front-surface-side metal layer;

a barrier layer which is provided on the upper surface of the front-surface-side metal layer, and provided being in direct contact with the plated layer on the upper surface of the front-surface-side metal layer; and an insulation protecting layer provided on the barrier layer, wherein the barrier layer is formed of Titanium nitride (TIN), and an end of the plated layer which is horizontally adjacent to the barrier layer and vertically in contact with the front-surface-side metal layer is provided in direct contact with a part of a horizontal upper surface of the barrier layer.

* * * * *